US010401446B2

(12) United States Patent
Lips

(10) Patent No.: US 10,401,446 B2
(45) Date of Patent: Sep. 3, 2019

(54) LAMINATE DESIGN-BASED RADIO FREQUENCY COIL UNIT FOR MRI

(71) Applicant: KONINKLIJKE PHILIPS N.V., Eindhoven (NL)

(72) Inventor: Oliver Lips, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 568 days.

(21) Appl. No.: 14/905,322

(22) PCT Filed: Jul. 15, 2014

(86) PCT No.: PCT/EP2014/065060
§ 371 (c)(1),
(2) Date: Jan. 15, 2016

(87) PCT Pub. No.: WO2015/007695
PCT Pub. Date: Jan. 22, 2015

(65) Prior Publication Data
US 2016/0169990 A1 Jun. 16, 2016

(30) Foreign Application Priority Data

Jul. 18, 2013 (EP) .................... 13176969

(51) Int. Cl.
*G01R 33/34* (2006.01)
*G01R 33/36* (2006.01)
*G01R 33/341* (2006.01)

(52) U.S. Cl.
CPC ..... *G01R 33/341* (2013.01); *G01R 33/34007* (2013.01); *G01R 33/3635* (2013.01)

(58) Field of Classification Search
CPC ............ G01R 33/341; G01R 33/34007; G01R 33/3635

(Continued)

(56) References Cited

U.S. PATENT DOCUMENTS 4,620,155 A * 10/1986 Edelstein ............. G08B 13/196
324/318
4,783,641 A * 11/1988 Hayes ................. G01R 33/341
324/318

(Continued)

FOREIGN PATENT DOCUMENTS

JP 2004235208 A 8/2004

OTHER PUBLICATIONS

Fujita et al.,RF Surface Receive Array Coils: The Art of an LC Circuit, Journal of Magnetic Resonance Imaging 38:12-25. 2013 Wiley Periodicals, Inc. (Year: 2013).*

(Continued)

*Primary Examiner* — Patrick Assouad
*Assistant Examiner* — Sean Curtis

(57) ABSTRACT

A radio frequency coil unit (10) for use in a magnetic resonance imaging system, the radio frequency coil unit (10) comprising: at least one electrically insulating substrate (18); at least one radio frequency coil member (12) disposed at a first side (22) $_o$f the electrically insulating substrate (18); a first capacitor member (26) disposed at the first side (22) of the electrically insulating substrate (18) and galvanically connected to the at least one radio frequency coil member (12); a second capacitor member (28) disposed at a second side (24) of the electrically insulating substrate (18) which is opposite of the first side (22); wherein the first capacitor member (26) and the second capacitor member (28) at least partially overlap in a direction (20) perpendicular to a surface of the electrically insulating substrate (18); and wherein the at least one radio frequency coil member (12), the first capacitor member (26) and the second capacitor member (28) are part of a radio frequency resonance circuit having a resonance frequency that coincides with the Larmor frequency, which is determined by a magnetic field strength of the magnetic resonance imaging system and the (Continued)

US 10,401,446 B2
Page 2 species of nuclei under investigation. The capacitor structure at the second side of the substrate has an integrated resonant loop structure of which the resoance properties are indicative of the capacitor values formed by the overlapping capacitor members.

17 Claims, 5 Drawing Sheets

(58) Field of Classification Search
USPC .................................................. 324/300–322
See application file for complete search history.

(56) References Cited

U.S. PATENT DOCUMENTS

| | | | | |
|---|---|---|---|---|
| 4,881,034 | A * | 11/1989 | Kaufman | G01R 33/3415 324/318 |
| 5,168,233 | A * | 12/1992 | Zibolski | G01R 33/341 324/318 |
| 5,256,971 | A * | 10/1993 | Boskamp | G01R 33/3628 324/318 |
| 6,184,684 | B1 * | 2/2001 | Dumoulin | G01R 33/3628 324/318 |
| 6,535,084 | B1 * | 3/2003 | Tropp | G01R 33/34076 324/318 |
| 6,661,229 | B2 * | 12/2003 | Weyers | G01R 33/34046 324/318 |
| 6,771,070 | B2 * | 8/2004 | Lee | G01R 33/3456 324/318 |
| 7,088,104 | B2 * | 8/2006 | Bottomley | G01R 33/3415 324/328 |
| 7,180,291 | B2 * | 2/2007 | Chmielewski | G01R 33/34046 324/318 |
| 7,642,781 | B2 * | 1/2010 | Ballon | G01R 33/34046 324/318 |
| 7,714,581 | B2 * | 5/2010 | Erickson | G01R 33/345 324/318 |
| 7,733,627 | B2 * | 6/2010 | Yu | H01G 4/33 361/303 |
| 8,053,673 | B2 * | 11/2011 | Kim | H05K 1/162 174/250 |
| 8,164,336 | B1 * | 4/2012 | Murphree, Jr. | G01R 33/345 324/318 |
| 8,193,811 | B2 * | 6/2012 | Tropp | G01R 33/3415 324/318 |
| 8,581,588 | B2 * | 11/2013 | Driesel | G01R 33/3415 324/307 |
| 9,035,655 | B2 * | 5/2015 | Freytag | G01R 33/3635 324/318 |
| 9,535,142 | B2 * | 1/2017 | Leussler | G01R 33/3415 |
| 9,709,645 | B2 * | 7/2017 | Lee | G01R 33/3415 |
| 2004/0140808 | A1 * | 7/2004 | Vaughan, Jr. | G01R 33/34046 324/318 |
| 2006/0232275 | A1 | 10/2006 | Leussler | |
| 2008/0143333 | A1 * | 6/2008 | Greim | G01R 33/34007 324/322 |
| 2010/0213941 | A1 * | 8/2010 | Driesel | G01R 33/3415 324/322 |
| 2011/0166437 | A1 * | 7/2011 | Chang | G01R 33/34084 600/411 |
| 2012/0242338 | A1 * | 9/2012 | Freytag | G01R 33/34076 324/322 |
| 2012/0319801 | A1 * | 12/2012 | Taniguchi | H03H 7/0115 333/185 |
| 2013/0076353 | A1 | 3/2013 | Biber | |
| 2013/0207660 | A1 * | 8/2013 | Lips | G01R 33/3657 324/322 |
| 2014/0055136 | A1 * | 2/2014 | Leussler | G01R 33/3415 324/309 |
| 2015/0002156 | A1 * | 1/2015 | Leussler | G01R 33/3635 324/322 |
| 2016/0033594 | A1 * | 2/2016 | Yang | G01R 33/3657 324/322 |
| 2016/0169990 | A1 * | 6/2016 | Lips | G01R 33/34007 324/322 |
| 2017/0089989 | A1 * | 3/2017 | Findeklee | G01R 33/34007 |
| 2017/0146622 | A1 * | 5/2017 | Yang | G01R 33/3628 |
| 2018/0259603 | A1 * | 9/2018 | Leussler | G01R 33/34007 |

OTHER PUBLICATIONS

Kim et al., Improvement of a 4-Channel Spiral-Loop RF Coil Array for TMJ MR Imaging at 7T, www.ksmrm.org JKSMRM 16(2) : 103-114, 2012 (Year: 2012).*

* cited by examiner

LAMINATE DESIGN-BASED RADIO FREQUENCY COIL UNIT FOR MRI

CROSS REFERENCE TO RELATED APPLICATIONS

This application is a U.S. national phase application of International Application No. PCT/EP2014/065060, filed on Jul. 15, 2014 which claims the benefit of EP Application Serial No. 13176969.7 filed on Jul. 18, 2013 and is incorporated herein by reference.

FIELD OF THE INVENTION

The invention pertains to a radio frequency coil for use in a magnetic resonance imaging system.

BACKGROUND OF THE INVENTION

In the art of magnetic resonance imaging it is known to employ radio frequency coils for transmitting radio frequency energy to nuclei under test for resonant excitation of the nuclei, as well as for receiving radio frequency energy generated by the nuclei after excitation. The transmitted or received radio frequency energy has a frequency that coincides with the Larmor frequency, which is known in the art to be determined by a local magnetic field strength of the magnetic resonance imaging system and the species of nuclei under investigation. For transmitting and receiving purposes, the radio frequency coils comprise resonant circuits having combinations of capacitors and inductors that are substantially tuned to the Larmor frequency.

For improved signal to noise ratio, it is known in the art to make use of local radio frequency coils that can be located proximal to a region of interest.

For these purposes, it is desirable to have a radio frequency coil of compact design that is easy to manufacture.

The US-patent application US2008/0143333 discloses an array antenna for MR applications. The known array antenna has multiple conductor loops of loop segments that are capacitively coupled as conductor traces of a circuit board.

SUMMARY OF THE INVENTION

It is therefore an object of the invention to provide a space-saving and easy-to-manufacture radio frequency coil unit for use in a magnetic resonance imaging system and in which radio frequency coil unit a resonance loop is integrated. This object is achieved by the radio frequency coil unit.

The radio frequency coil unit comprises at least one electrically insulating substrate, at least one radio frequency coil member formed as an electrically conductive pattern disposed at a first side of the electrically insulating substrate, and being configured to serve as an inductance member of the radio frequency coil unit.

The radio frequency coil unit further comprises a first capacitor member formed as an electrically conductive pattern disposed at the first side of the electrically insulating substrate and galvanically connected to the at least one radio frequency coil member. Moreover, the radio frequency coil unit comprises a second capacitor member formed as an electrically conductive pattern disposed at a second side of the electrically insulating substrate which is opposite of the first side, wherein the first capacitor member and the second capacitor member at least partially overlap in a direction perpendicular to a surface of the electrically insulating substrate.

The at least one radio frequency coil member, the first capacitor member and the second capacitor member are part of a radio frequency resonance circuit having a resonance frequency that coincides with the Larmor frequency, which is determined by a magnetic field strength of the magnetic resonance imaging system and the species of nuclei under investigation.

The phrase "radio frequency", as used in this application, shall be understood particularly as a range of the electromagnetic spectrum between 1 MHz and 1 GHz. By way of example, the Larmor frequency for frequently investigated protons ($^1$H) is about 42.6 MHz at a local magnetic field strength of 1 T.

In this way, capacitor members can readily be connected to the radio frequency coil member that is designed as an electrically conductive pattern on an electrically insulating substrate, so as to provide a radio frequency resonance circuit that is tuned to the Larmor frequency. In particular, via holes for connecting electrically conductive patterns disposed at opposite sides of the at least one electrically insulating substrate can be omitted in the assembly of the radio frequency coil unit. By that, a space-saving and easy-to-manufacture radio frequency coil unit for use in a magnetic resonance imaging system can be provided, as the number of electrical connections between the radio frequency coil member and lumped capacitors, as is required in the prior art, can at least be reduced.

As is clear to the person skilled in the art, the radio frequency coil unit may as well comprise input terminals for providing radio frequency power to the radio frequency unit from an external device, and output terminals to extract radio frequency signals from the radio frequency coil unit to an outer environment for evaluation.

In one embodiment, the at least one electrically insulating substrate may be shaped as a planar plate. In another embodiment, it may be shaped as a plate with parallel, curved surfaces, wherein a radius of curvature is adapted to an outer shape of the subject of interest. The electrically insulating substrate may be made from a plastic material, which may be reinforced by fibers embedded in the plastic material.

In a preferred embodiment, the radio frequency coil member, the first capacitor member, the second capacitor member, and the at least one electrically insulating substrate are laminated. The phrase "laminated", as used in this application, shall be understood particularly as being permanently assembled by heat, pressure, welding, or adhesives. In this way, a radio frequency coil unit can be provided that is robust and insensitive to changes of relative positions of the radio frequency coil member, the first capacitor member, the second capacitor member, and the at least one electrically insulating substrate due to handling during arranging the radio frequency coil unit prior to a magnetic resonance imaging session, for instance at a subject of interest.

In another preferred embodiment, the radio frequency unit comprises a printed circuit board, wherein the at least one electrically insulating substrate is formed by a non-conducting substrate of the printed circuit board, and wherein the at least one radio frequency coil member is formed as a first conductive pattern and the first capacitor member is formed as a second conductive pattern, the first and second conductive pattern being laminated to a first side of the non-conducting substrate, and wherein the second capacitor member is formed as a third conductive pattern being laminated to a second side of the non-conducting substrate which is opposite of the first side.

By that, the radio frequency coil unit can be manufactured from a readily available material which allows for an especially easy manufacturing. The non-conducting substrate of the printed circuit board may preferably comprise cured phenolic resin or cured epoxy resin, each of which may be reinforced by paper and/or glass fibers.

In yet another embodiment, the radio frequency coil unit further comprises a third capacitor member and a fourth capacitor member, wherein the third capacitor member is formed as an electrically conductive pattern disposed at the second side of the electrically insulating substrate, and is galvanically connected to the second capacitor member by an electrically conductive pattern, and wherein the fourth capacitor member is formed as an electrically conductive pattern disposed at the first side of the electrically insulating substrate, and wherein the third capacitor member and the fourth capacitor member are configured to serve as parts of the radio frequency resonance circuit.

By that, two capacitor members can readily be connected to the radio frequency coil member in a symmetric way, which may be advantageous with respect to a requirement regarding current density.

Preferably, the third capacitor member and the fourth capacitor member at least partially overlap in the direction perpendicular to a surface of the electrically insulating substrate to achieve a wide range of capacitance values of the second capacitor, providing large design freedom for the resonance circuit.

In still another embodiment, the second capacitor member comprises at least two mutually insulated second capacitor member portions and the third capacitor member comprises at least two mutually insulated third capacitor member portions. Further, the galvanic connection comprises at least two electrically conductive patterns, and each one of the at least two electrically conductive patterns galvanically connects one of the two mutually insulated second capacitor member portions with one of two mutually insulated third capacitor member portions, wherein the at least two electrically conductive patterns are disposed in a spaced relationship. The structure formed by the second capacitor member portions, the third capacitor member portions and the bridge patterns forms an integrated resonance loop. Notably, the second capacitor member portions and the third capacitor member portions are spaced apart so that a slit is left between them. The bridge patterns extend along the slit and form galvanic connections between respecive second capacitor member portions and third capacitor member portions. Thus, a resonance loop in formed integrated in the layer structure (laminate or printed circuit board). The resonance properties such as frequency, attenuation and impedance of this integrated resonant loop is indicative of the local capacitor values of the overlapping capacitor members.

This design incorporating the integrated resonance loop can allow for suitable test modes that are applicable to the capacitor members independent of the regular function of the resonance circuit in an operational mode, and that are indicative of a capacitance value of the capacitor members.

In a suitable embodiment, a radio frequency test current may be applied and driven through the first capacitor member, the second capacitor member portions, the first one of the at least two electrically conductive patterns, the third capacitor member portions, the fourth capacitor member, and through the second one of the at least two electrically conductive patterns. The capacitor members and the at least one radio frequency coil member form a second radio frequency resonance circuit that is excitable by the radio frequency test current. A determined resonance frequency of the second radio frequency resonance circuit depends on the capacitance values of the capacitor members, and can thus be used to determine the capacitance values independent of the regular function of the radio frequency coil unit. The radio frequency test current may be applied by using an open-loop control circuit and exploiting a change of impedance of the second radio frequency resonance circuit, or by using a closed-loop control circuit, wherein a control signal of the control circuit is a measure of the impedance of the second radio frequency resonance circuit. In general, other types or combinations of control circuits are applicable that appear to be suitable to the person skilled in the art.

The portions of the at least two capacitor members can preferably be electrically arranged in series, so that the interaction takes place at a frequency that is much higher than a Larmor frequency under consideration, and thus any radio frequency interference can be avoided.

In another preferred embodiment, the radio frequency coil unit further comprises a sensing coil having a sensing coil area, wherein in the direction perpendicular to the surface of the electrically insulating substrate, the sensing coil area at least partially overlaps a region between the at least two electrically conductive patterns of the galvanic connection between the second capacitor member and the third capacitor member, and wherein the sensing coil is connectable to a radio frequency transmitter and is configured to couple a magnetic field component of the radio frequency power from the radio frequency transmitter to the region between the at least two electrically conductive patterns of the galvanic connection.

In this way, the radio frequency test current can readily be applied by inductive coupling, making use of Faraday's law of induction, without a necessity for additional electrical wiring connected to the capacitor members. As another beneficial effect, omitting additional wiring avoids potential electromagnetic interference.

In still another embodiment, the radio frequency coil unit further comprises at least one short circuit member, wherein the at least two electrically conductive patterns are galvanically connected by the least one short circuit member. Preferably, the at least one short circuit member is formed as an electrically conductive pattern disposed at the second side of the electrically insulating substrate. Most preferable, the at least one short circuit member is arranged in a mid region of the at least two electrically conductive patterns. The phrase "mid region of the electrically conductive pattern", as used in this application, shall be understood particularly as a region of the electrically conductive pattern that comprises half of a total length of the electrically conductive pattern in a direction of extension, wherein ends of the mid region are equally spaced apart from ends of the electrically conductive pattern.

Among the advantages of the disclosed radio frequency coil unit are that two currents flowing independently before (i.e. if the short circuit member were not applied) in the two electrically conductive patterns, are coupled by the short circuit member, with the effect of equalizing the currents and reducing current density rating requirements. Further, the at least one short circuit member provides at least another path for an electric radio frequency current to flow, whereby at least another, independent oscillating mode of the second resonance circuit can be excited. In this circuit lay-out the slit between the second capacitor member portions and between the third capacitor member portions is crossed by the short circuit member, effectively forming two slits separated by the short circuit member. This arrangement supports a butterfly-like pattern as well as a ring-like pattern for the electrical current running in the integrated multilpe loop structure. These respective patterns probe the involved capacitors differently.

In another preferred embodiment, the radio frequency coil unit further comprises at least one lumped tuning capacitor that is galvanically connected to two electrically conductive patterns disposed at the first side of the electrically insulating substrate and is configured for tuning a resonance frequency of the radio frequency resonance circuit. By that, an overall tuning of the resonance frequency of the radio frequency resonance circuit to the Larmor frequency can readily be accomplished.

BRIEF DESCRIPTION OF THE DRAWINGS

These and other aspects of the invention will be apparent from and elucidated with reference to the embodiments described hereinafter. Such embodiment does not necessarily represent the full scope of the invention, however, and reference is made therefore to the claims and herein for interpreting the scope of the invention.

In the drawings.

DETAILED DESCRIPTION OF EMBODIMENTS

In the following, several embodiments of a radio frequency coil unit in accordance with the invention are disclosed. The individual embodiments are described with reference to a particular figure and are identified by a prefix number of the particular embodiment. Features whose function is the same or basically the same in all embodiments are identified by reference numbers made up of the prefix number of the embodiment to which it relates, followed by the number of the feature. If a feature of an embodiment is not described in the corresponding figure depiction, or a reference number mentioned in a figure depiction is not shown in the figure itself, reference should be made to the description of a preceding embodiment.

Figure 1:
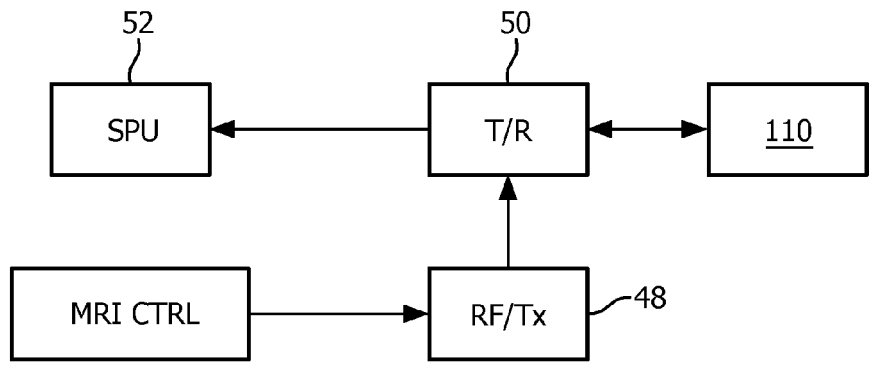
FIG. 1 schematically illustrates an embodiment of a radio frequency coil unit in accordance with the invention.

FIG. 1 schematically shows a first embodiment of a radio frequency coil unit 110 for use in a magnetic resonance imaging system. The radio frequency coil unit 110 is designed as a local radio frequency coil that is provided for applying a radio frequency magnetic field to excite nuclei within a subject of interest during radio frequency transmit periods of the magnetic resonance imaging system. The radio frequency coil unit 110 is also provided to receive magnetic resonance signals from the excited nuclei during radio frequency receive periods. To this end, the magnetic resonance imaging system comprises a radio frequency transmitter unit 48 and a transmit/receive switching unit 50 connecting the radio frequency coil unit 110 and a signal processing unit 52 of the magnetic resonance imaging system. During a radio frequency transmit period, the transmit/receive switching unit 50 is configured to connect the radio frequency transmitter unit 48 to the frequency coil unit 110 and to disconnect the signal processing unit 52. During a radio frequency receive period, the transmit/receive switching unit 50 is configured to connect the radio frequency coil unit 110 with the signal processing unit 52, and to disconnect the radio frequency transmitter unit 48. In a state of operation of the magnetic resonance imaging system, radio frequency transmit periods and radio frequency receive periods are taking place in a consecutive manner. All of this is well known in the art.

In general, as will become obvious to the person skilled in the art, the invention is as well applicable to other radio frequency coil units used in a magnetic resonance imaging system.

The radio frequency coil unit 110 comprises a plate-shaped electrically insulating substrate 118 that is made from fiber-reinforced epoxy resin. A surface of each side 122, 124 of the electrically insulating substrate 118 has originally been covered with a thin copper sheet, and the assembly of the electrically insulating substrate 118, the copper sheet on a first side 122 of the electrically insulating substrate 118, and the copper sheet on the second side 124 of the electrically insulating substrate 118 has been laminated. The material that was used for manufacturing the radio frequency coil unit 110 is commercially available and known as FR-4 (both-sides) copper-clad laminate.

In this way, the electrically insulating substrate 118 is formed by the non-conducting substrate of the printed circuit board. In a manufacturing process of the radio frequency coil unit 110, the copper layers laminated to both surfaces of the non-conducting substrate 118 have been partially etched off to create electrically conductive patterns that serve various purposes, as will be described in the following. Disposed at the first side 122 of the electrically insulating substrate 118, a radio frequency coil member 112 is formed as a first electrically conductive pattern. The radio frequency coil member 112 is configured to serve as an inductance member of a radio frequency resonance circuit of the radio frequency coil unit 110. In an upper part of FIG. 2, a first end 114 and a second end 116 of a loop-like copper sheet strip pattern forming the radio frequency coil member 112 are shown in part.

Figure 2:
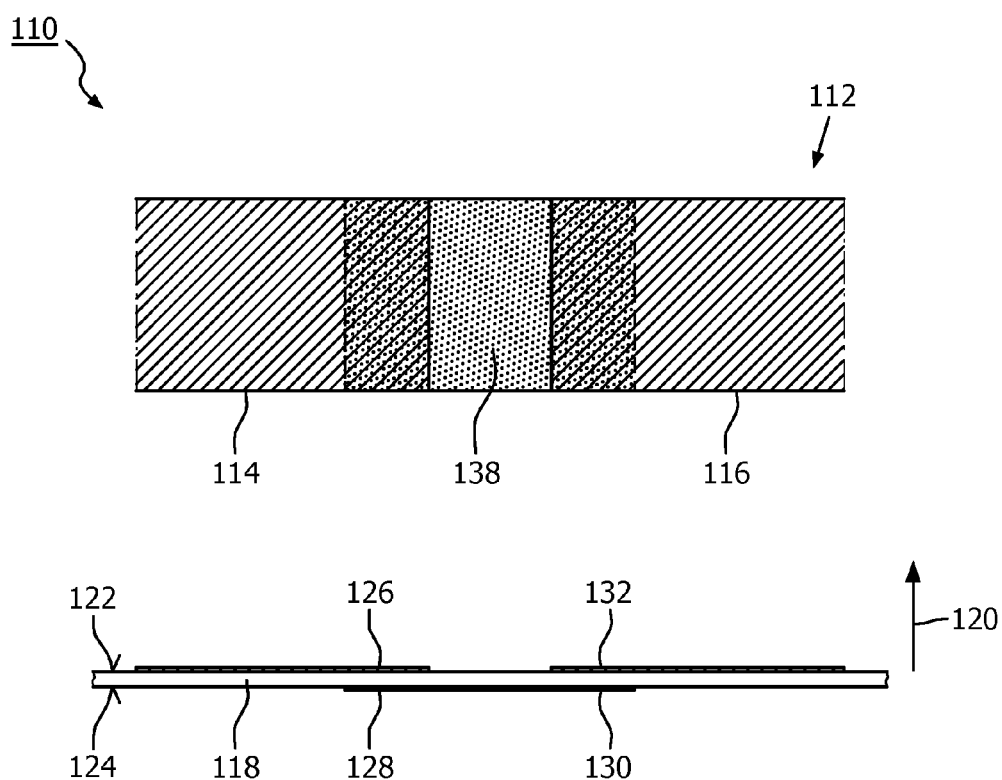
FIG. 2 shows a detail of the radio frequency coil unit pursuant to FIG. 1 in a top view (upper part) and a side view (lower part)

Galvanically connected to the first end 114 of the radio frequency coil member 112 shown in the left of FIG. 2 is a first capacitor member 126 formed as a second electrically conductive pattern disposed at the first side 122 of the electrically insulating substrate 118.

A second capacitor member 128 formed as a third electrically conductive pattern is disposed at the second side 124 of the electrically insulating substrate 118 which is opposite of the first side 122. The second capacitor member 128 is positioned such that the first capacitor member 126 and the second capacitor member 128 partially overlap in a direction 120 perpendicular to a surface of the electrically insulating substrate 118.

The radio frequency coil unit 110 further comprises a third capacitor member 130 and a fourth capacitor member 132. The third capacitor member 130 is formed as a fourth electrically conductive pattern disposed at the second side 124 of the electrically insulating substrate 118. The third capacitor member 130 is galvanically connected to the second capacitor member 128 by an electrically conductive bridge pattern 138. The fourth capacitor member 132 is formed as a fifth electrically conductive pattern disposed at the first side 122 of the electrically insulating substrate 118. The fourth capacitor member 132 is positioned such that the fourth capacitor member 132 and the third capacitor member 134 partially overlap in the direction 120 perpendicular to a surface of the electrically insulating substrate 118.

The radio frequency coil member 110, the first capacitor member 126, the second capacitor member 128, the third capacitor member 130, and the fourth capacitor member 132 are configured to serve as parts of the radio frequency resonance circuit having a resonance frequency that is close within a range of ±2% to the Larmor frequency of 128 MHz, which is determined by a magnetic field strength of the magnetic resonance imaging system of 3 T and the species of nuclei under investigation, which in this embodiment are protons (hydrogen nuclei $^1$H). In an operational state of the radio frequency coil unit 110, a radio frequency current in a given instant flows in a direction from the first end 114 of the radio frequency coil member 112 through the first capacitor member 126 (FIG. 3), the second capacitor member 128, the electrically conductive bridge pattern 138, the third capacitor member 130, the fourth capacitor member 132, and the second end 116 of the radio frequency coil member 112, which demonstrates that the radio frequency coil member 112 and the capacitor members 126, 128, 130, 132 are electrically connected in series.

Figure 3:
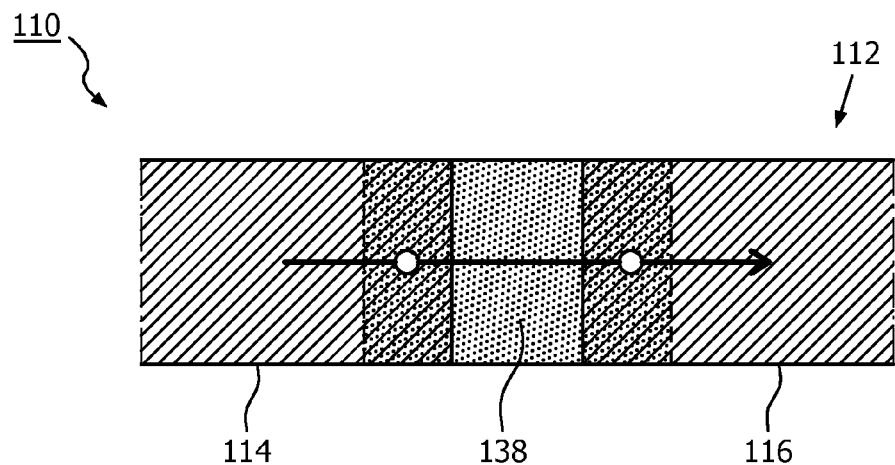
FIG. 3 illustrates a path of a radio frequency current in the radio frequency coil unit pursuant to FIG. 2 in an operational mode in a given instant.

The description of the following alternative or further elaborated embodiments of a radio frequency coil unit is confined to differences with regard to the embodiment of the radio frequency coil unit 110 pursuant to FIGS. 1 to 3.

Figure 4:
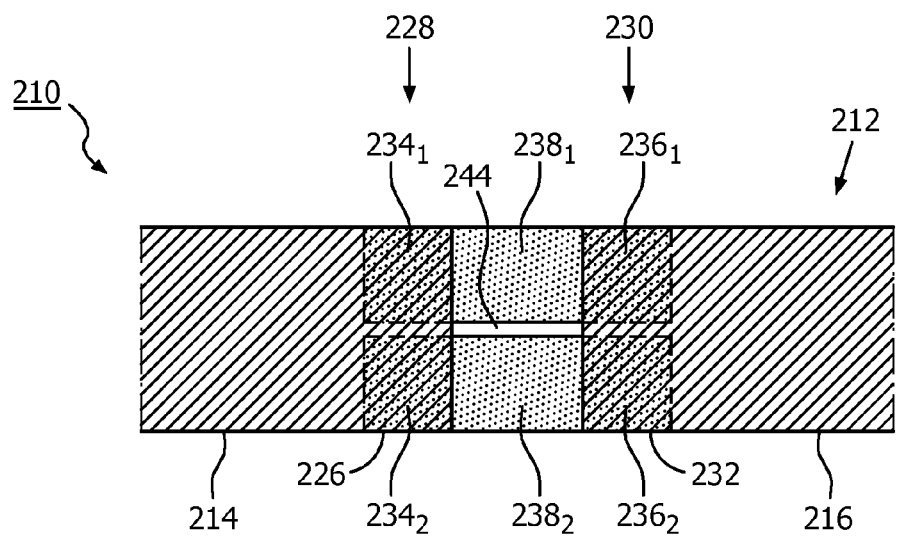
FIG. 4 illustrates a detail of another embodiment of a radio frequency coil unit in accordance with the invention in a top view (upper part) and a side view (lower part)

A detail of another embodiment of a radio frequency coil unit 210 is schematically shown in FIG. 4. Therein, a second capacitor member 228 comprises two mutually insulated second capacitor member portions $234_1$, $234_2$. A third capacitor member 230 comprises two mutually insulated third capacitor member portions $236_1$, $236_2$. A galvanic connection between the second capacitor member 228 and the third capacitor member 230 comprises two electrically conductive bridge patterns $238_1$, $238_2$. Each of the two electrically conductive patterns $238_1$, $238_2$ galvanically connects one of the two mutually insulated second capacitor member portions $234_1$, $234_2$ with one of the two mutually insulated third capacitor member portions $236_1$, $236_2$. The two electrically conductive bridge patterns $238_1$, $238_2$ are aligned in parallel and are disposed in a spaced relationship, so that a slot 244 is formed by edges of the first capacitor member 226, the third capacitor member 230, and the two electrically conductive bridge patterns $238_1$, $238_2$.

Although not shown in detail, it is obvious to the person skilled in the art that in an operational mode of the radio frequency coil unit 220, a radio frequency current in a given instant flows in a direction from a first end 214 of the radio frequency coil member 212 through the first capacitor member 226 where the radio frequency current is split to continue to the two second capacitor member portions $234_1$, $234_2$. The radio frequency current is then flowing in two independent partial currents along the two electrically conductive bridge patterns $238_1$, $238_2$ to the two mutually insulated third capacitor member portions $236_1$, $236_2$, where it is recombined in the fourth capacitor member 232, and continues along a second end 216 of the radio frequency coil member 212. In this way, the first capacitor member 226 and the second capacitor member portions $234_1$, $234_2$ are electrically connected in series to the radio frequency coil member, wherein the two second capacitor member portions $234_1$, $234_2$ are electrically connected in parallel. In a similar manner, the third capacitor member portions $236_1$, $236_2$ and the fourth capacitor member 232 are electrically connected in series to the radio frequency coil member 212, wherein the two third capacitor member portions $236_1$, $236_2$ are electrically connected in parallel.

Figure 5:
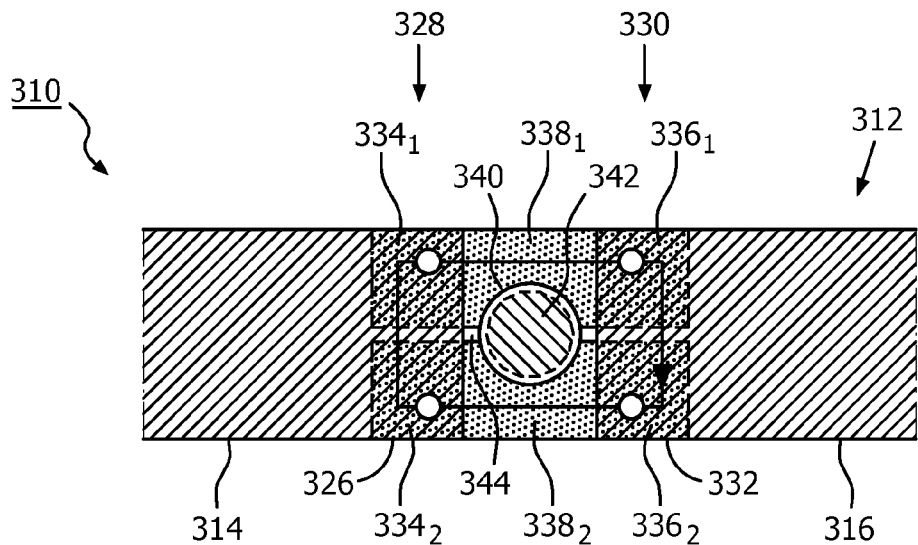
FIG. 5 illustrates a detail of yet another embodiment of a radio frequency coil unit in accordance with the invention.

FIG. 5 illustrates a detail of yet another embodiment of a radio frequency coil unit 310. In this embodiment, the radio frequency coil unit 310 in comparison to the embodiment pursuant to the one in FIG. 4 further comprises a sensing coil 340 having a sensing coil area 342, wherein in a direction 320 perpendicular to a surface of an electrically insulating substrate 318, the sensing coil area 342 partially overlaps a region between two electrically conductive bridge $338_1$, $338_2$ patterns of a galvanic connection between a second capacitor member 328 and a third capacitor member 330. The sensing coil 340 is connectable to a radio frequency transmitter (not shown) and is configured to couple a magnetic field component of the radio frequency power from the radio frequency transmitter to the region between the at least two electrically conductive bridge patterns $338_1$, $338_2$ of the galvanic connection. This is facilitated by a slot 344 formed by copper sheets that partially overlap in a direction 320 perpendicular to the electrically insulating substrate 318, so that the magnetic field component of the radio frequency power from the radio frequency transmitter can penetrate the electrically insulating substrate 318 via the slot.

According to Faraday's law of induction, the magnetic field component of the radio frequency power from the radio frequency transmitter induces a test current that in a given instant is driven through the first capacitor member 326, a first one $334_1$ of second capacitor member portions $334_1$, $334_2$, a first one $338_1$ of two electrically conductive bridge patterns $338_1$, $338_2$, a first $336_1$ one of third capacitor member portions $336_1$, $336_2$, a fourth capacitor member 332, a second one of third capacitor member portions, through the second one of the two electrically conductive patterns, a second one $334_2$ of the second capacitor member portions $334_1$, $334_2$, and back to the first capacitor member 326. The capacitor members 326, $334_1$, $334_2$, $336_1$, $336_2$, 332 and the radio frequency coil member 312 form a second radio frequency resonance circuit that is excitable by the radio frequency test current. A determined resonance frequency of the second radio frequency resonance circuit depends on the capacitance values of the capacitor members 326, $334_1$, $334_2$, $336_1$, $336_2$, 332, and can thus be used to determine their capacitance values independent of a regular function of the radio frequency coil unit 310 in an operational mode. As the first capacitor member 326, the two portions of the second capacitor member $334_1$, $334_2$, the two portions of the third capacitor member $336_1$, $336_2$, and the fourth capacitor member 332 are all connected in series with regard to the radio frequency test current, a resonance frequency of the second radio frequency resonance circuit is much higher than a resonance frequency of the radio frequency coil unit 310 in the operational mode. Therefore, no radio frequency interference has to be expected when applying the radio frequency test current during regular operation of the radio frequency coil unit 310.

The sensing coil 340 comprises in-/output leads not shown in FIG. 5 for clarity reasons, for connecting to the radio frequency transmitter, and for transmitting any signals (particularly indicative of radio frequency power, impedance, and/or voltage drop) indicative of a response of the second radio frequency resonance circuit to the radio frequency test current. In this way, these signals can be transferred outside of the radio frequency coil unit 310 and evaluated by any suitable device known in the art, including filters, amplifiers, FFT devices, combinations thereof, or other devices that appear suitable to the person skilled in the art.

By applying a radio frequency test current that comprises frequencies of a suitable frequency band, or, alternatively, by consecutively applying a radio frequency test current comprising a different radio frequency (sweeping) in a wobbling mode, a response of a second resonance circuit to the radio frequency test current can be obtained.

Figure 8:
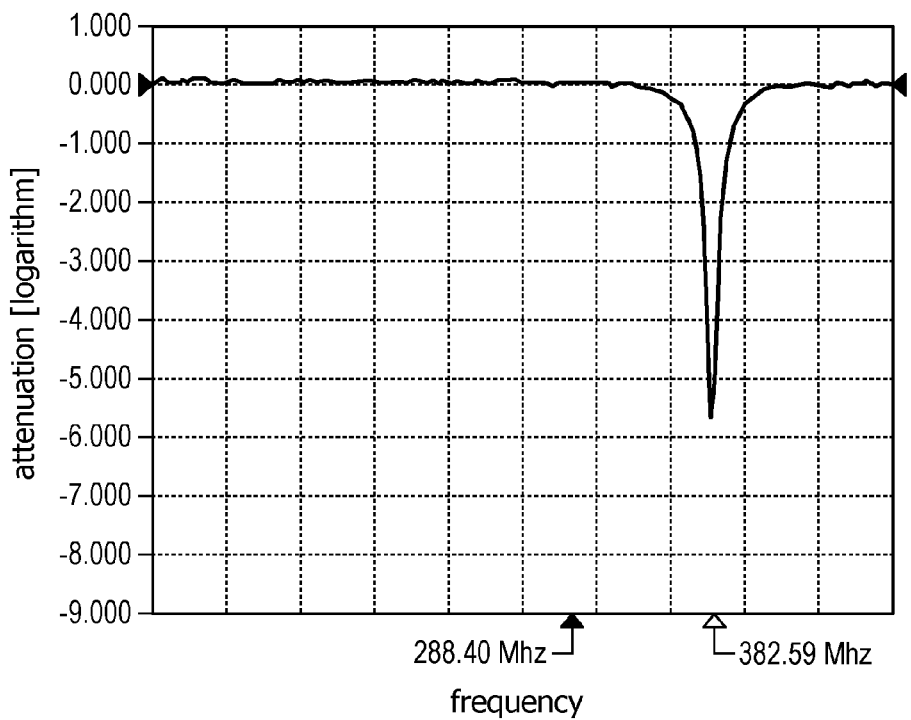
FIG. 8 is a frequency response of the radio frequency coil unit pursuant to FIGS. 4 and 5 to a test current.

FIG. 8 is a frequency response of the second resonance circuit determined in the described way, illustrating the resonance at a frequency of about 383 MHz.

Figure 6:
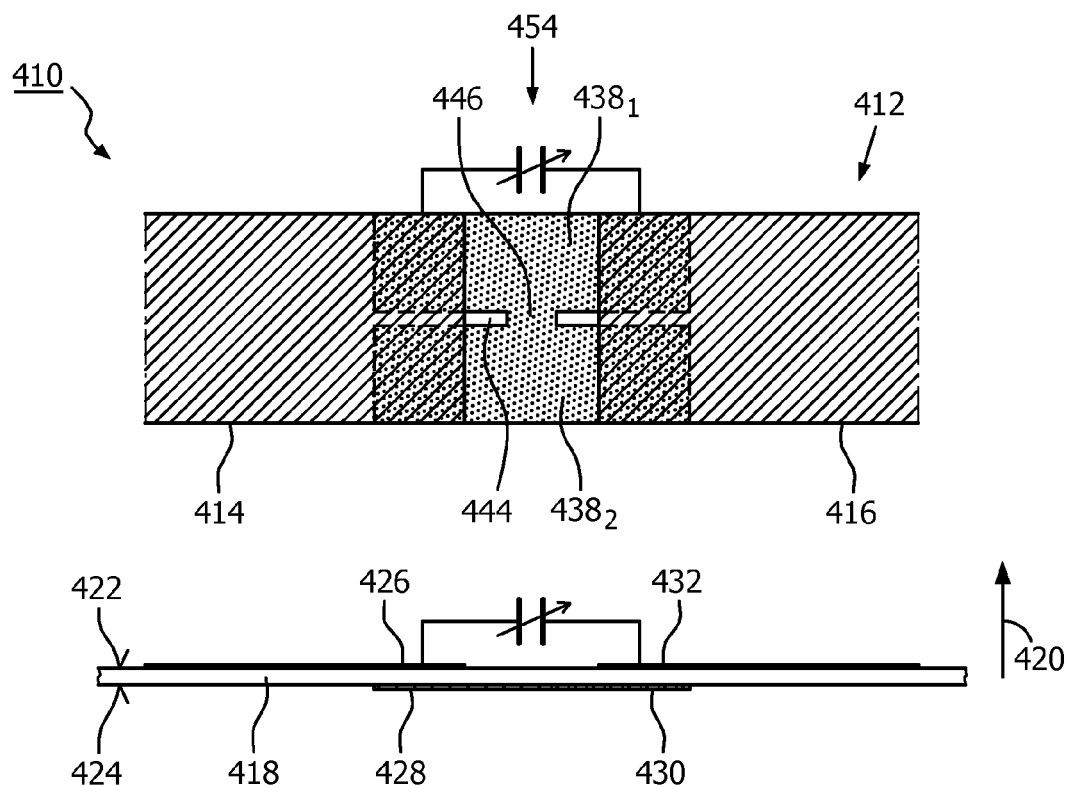
FIG. 6 illustrates a detail of still another embodiment of a radio frequency coil unit in accordance with the invention in a top view (upper part) and a side view (lower part)

FIG. 6 illustrates a detail of yet another embodiment of a radio frequency coil unit 410. In this embodiment, the radio frequency coil unit 410 further comprises a short circuit member 446, formed by an additional electrically conductive pattern disposed at a second side 424 of an electrically insulating substrate 418. The additional electrically conductive pattern galvanically connects two electrically conductive bridge patterns $438_1$, $438_2$ arranged between two mutually insulated second capacitor member portions $434_1$, $434_2$ and two mutually insulated third capacitor member portions $436_1$, $436_2$, as described in the captions of the embodiments pursuant to FIGS. 4 and 5. The additional electrically conductive pattern is arranged in a mid region of the two electrically conductive bridge patterns $438_1$, $438_2$.

Figure 7:
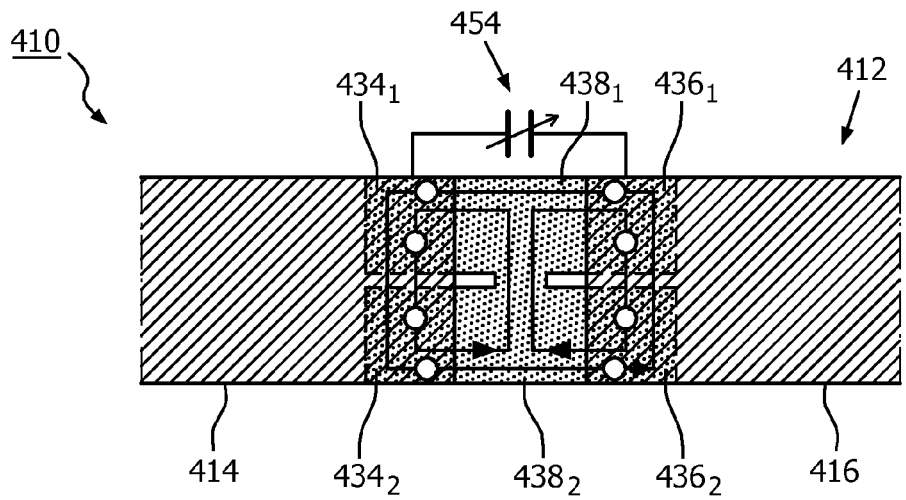
FIG. 7 depicts potential paths of a radio frequency test currents in the radio frequency coil unit pursuant to FIG. 6.

As indicated in FIG. 7, the short circuit member 446 allows for exciting a different Eigenmode than the one described in the embodiments pursuant to FIGS. 4 and 5 by applying a radio frequency test current. This Eigenmode is characterized by a simultaneous flow of two partial radio frequency currents.

A path of one of the two partial radio frequency currents in a given instant runs from the short circuit member 446 to a first one $438_1$ of two electrically conductive bridge patterns $438_1$, $438_2$, a first one $434_1$ of two second capacitor member portions $434_1$, $434_2$, to a first capacitor member 426, a second one $434_2$ of the two second capacitor member portions $434_1$, $434_2$, a second one $438_2$ of two electrically conductive bridge patterns $438_1$, $438_2$, and back to the short circuit member 446.

A path of the other of the two partial radio frequency currents in a given instant runs from the short circuit member 446 to the first $438_1$ one of two electrically conductive bridge patterns $438_1$, $438_2$, a first one $436_1$ of two third capacitor member portions $436_1$, $436_2$, to a fourth capacitor member 432, a second one $436_2$ of two third capacitor member portions $436_1$, $436_2$, the second one $438_2$ of the two electrically conductive bridge patterns $438_1$, $438_2$, and back to the short circuit member 446.

Figure 9:
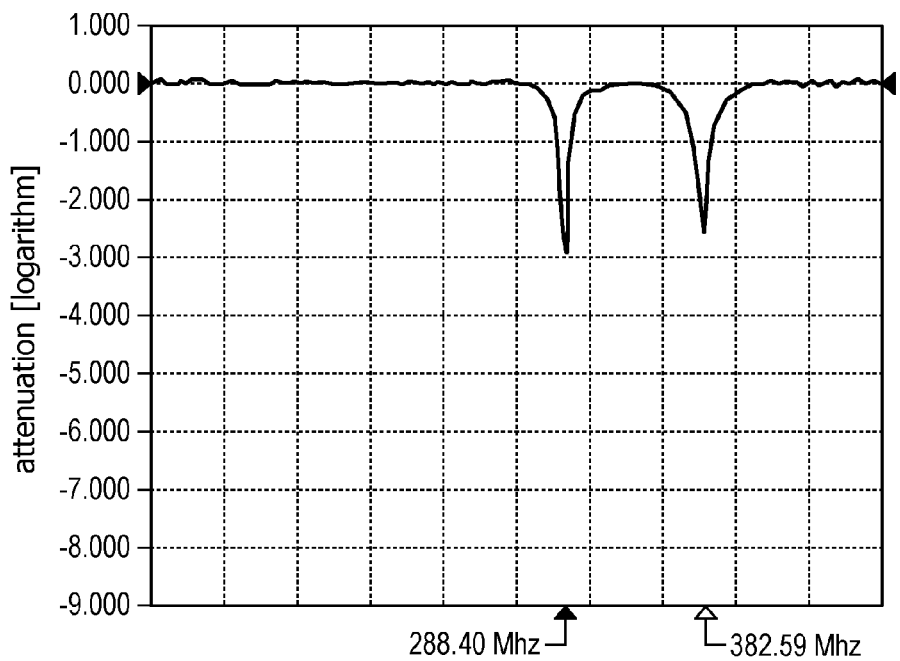
FIG. 9 is a frequency response of the radio frequency coil unit pursuant to FIGS. 6 and 7 to a test current.

The additional Eigenmode frequency is clearly visible in the frequency response shown in FIG. 9 as another resonance at a frequency of about 288 MHz.

As is shown in FIGS. 6 and 7, the radio frequency coil unit 410 further comprises a lumped tuning capacitor 454 that is galvanically connected to the first capacitor member 426 with its one end, and to the fourth capacitor member 432 with its other end, both capacitor members 426, 432 formed as electrically conductive patterns disposed and laminated to the first side 422 of the electrically insulating substrate 418. The lumped tuning capacitor 454 is configured for tuning a resonance frequency of the radio frequency resonance circuit of the radio frequency coil unit 410.

Figure 10:
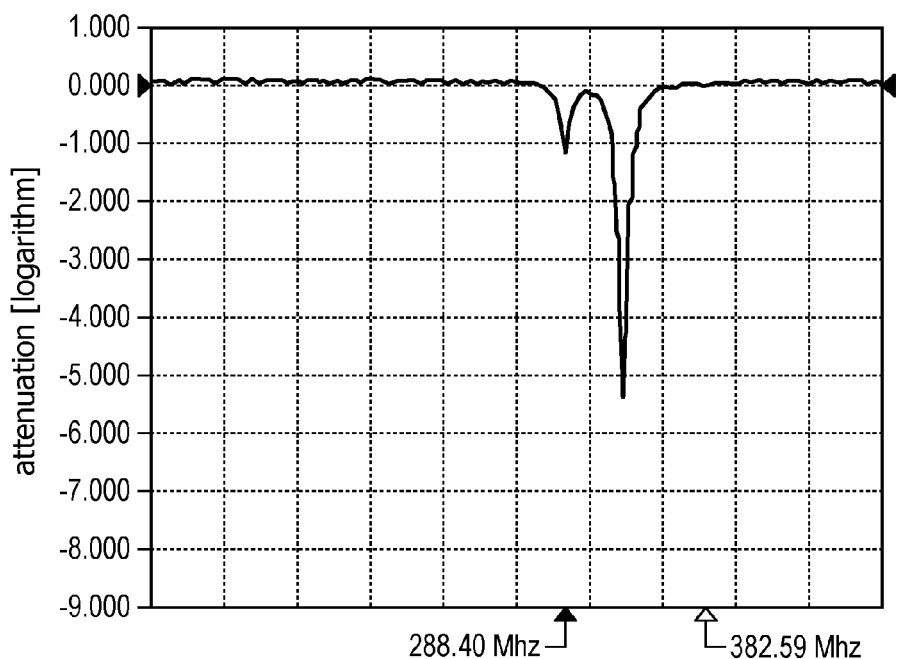
FIG. 10 is a frequency response of the radio frequency coil unit pursuant to FIGS. 6 and 7 to a test current, after adding a lumped tuning capacitor.

FIG. 10 represents a frequency response showing the effect of the lumped tuning capacitor 454 on the Eigenmode frequencies of the second radio frequency resonance circuit. Due to symmetry reasons, the resonance frequency of the second Eigenmode remains unchanged, whereas the resonance frequency of the first Eigenmode is downshifted by about 50 MHz.

While the invention has been illustrated and described in detail in the drawings and foregoing description, such illustration and description are to be considered illustrative or exemplary and not you; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A radio frequency coil unit for use in a magnetic resonance imaging system, the radio frequency coil unit comprising:
   at least one electrically insulating substrate;
   at least one radio frequency coil member formed as an electrically conductive pattern disposed at a first side of the electrically insulating substrate, and being configured to serve as an inductance member of the radio frequency coil unit;
   a first capacitor member formed as an electrically conductive pattern disposed at the first side of the electrically insulating substrate and galvanically connected to the at least one radio frequency coil member;
   a second capacitor member formed as an electrically conductive pattern disposed at a second side of the electrically insulating substrate which is opposite of the first side; wherein the first capacitor member and the second capacitor member at least partially overlap in a direction perpendicular to a surface of the electrically insulating substrate;
   a third capacitor member and a fourth capacitor member, wherein the third capacitor member is formed as an electrically conductive pattern disposed at the second side of the electrically insulating substrate, and wherein the fourth capacitor member is formed as an electrically conductive pattern disposed at the first side of the electrically insulating substrate, wherein the third capacitor member and the fourth capacitor member at least partially overlap in the direction perpendicular to a surface of the electrically insulating substrate;
   two electrically conductive bridge patterns disposed at the second side of the electrically insulating substrate in a spaced relationship, wherein the second capacitor member comprises two mutually insulated second capacitor member portions both disposed at the second side of the electrically insulating substrate, the third capacitor member comprises two mutually insulated third capacitor member portions both disposed at the second side of the electrically insulating substrate, and wherein each one of two electrically conductive bridge patterns galvanically connects one of the two mutually insulated second capacitor member portions with one of two mutually insulated third capacitor member portions;

wherein the at least one radio frequency coil member, the first capacitor member, the second capacitor member, and the two electrically conductive bridge patterns are part of a radio frequency resonance circuit having a resonance frequency that coincides with the Larmor frequency, which is determined by a magnetic field strength of the magnetic resonance imaging system and the species of nuclei under investigation; and wherein the two mutually insulated second capacitor member portions, the two mutually insulated third capacitor member portions, and the two electrically conductive bridge patterns form a sensing coil having a sensing coil area disposed between the at least two electrically conductive bridge patterns wherein the sensing coil is connectable to a radio frequency transmitter;

wherein a resonance frequency of the sensing coil is higher than the resonance frequency of radio frequency resonance circuit.

2. The radio frequency coil unit as set forth in claim 1, wherein the radio frequency coil member, the first capacitor member, the second capacitor member, and the at least one electrically insulating substrate are laminated.

3. The radio frequency coil unit as set forth in claim 1, comprising a printed circuit board, wherein the at least one electrically insulating substrate is formed by a non-conducting substrate of the printed circuit board, and wherein the at least one radio frequency coil member is formed as a first conductive pattern and the first capacitor member is formed as a second conductive pattern, the first and second conductive pattern being laminated to the first side of the non-conducting substrate, and wherein the second capacitor member is formed as a third conductive pattern being laminated to a second side of the non-conducting substrate which is opposite of the first side.

4. The radio frequency coil unit as set forth in claim 1, further comprising at least one short circuit member, wherein the two electrically conductive bridge patterns are galvanically connected by the least one short circuit member.

5. The radio frequency coil unit as set forth in claim 1, further comprising at least one lumped tuning capacitor that is galvanically connected to two electrically conductive patterns disposed at the first side of the electrically insulating substrate and is configured for tuning a resonance frequency of the radio frequency resonance circuit.

6. The radio frequency coil unit as set forth in claim 2, comprising a printed circuit board, wherein the at least one electrically insulating substrate is formed by a non-conducting substrate of the printed circuit board, and wherein the at least one radio frequency coil member is formed as a first conductive pattern and the first capacitor member is formed as a second conductive pattern, the first and second conductive pattern being laminated to the first side of the non-conducting substrate, and wherein the second capacitor member is formed as a third conductive pattern being laminated to a second side of the non-conducting substrate which is opposite of the first side.

7. The radio frequency coil unit as set forth in claim 2, further comprising at least one lumped tuning capacitor that is galvanically connected to two electrically conductive patterns disposed at the first side of the electrically insulating substrate and is configured for tuning a resonance frequency of the radio frequency resonance circuit.

8. A radio frequency coil unit for use in a magnetic resonance imaging system, the radio frequency coil unit comprising:
   at least one electrically insulating substrate;
   at least one radio frequency coil member formed as an electrically conductive pattern disposed at a first side of the electrically insulating substrate, and being configured to serve as an inductance member of the radio frequency coil unit;
   a first capacitor member formed as an electrically conductive pattern disposed at the first side of the electrically insulating substrate and galvanically connected to the at least one radio frequency coil member;
   a second capacitor member formed as an electrically conductive pattern disposed at a second side of the electrically insulating substrate which is opposite of the first side, wherein the first capacitor member and the second capacitor member at least partially overlap in a direction perpendicular to a surface of the electrically insulating substrate;
   wherein the at least one radio frequency coil member, the first capacitor member and the second capacitor member are part of a radio frequency resonance circuit having a resonance frequency;
   a third capacitor member formed as an electrically conductive pattern disposed at the second side of the electrically insulating substrate;
   at least two electrically conductive bridge patterns disposed at the second side of the electrically insulating substrate and galvanically connecting the third capacitor member to the second capacitor member;
   a fourth capacitor member formed as an electrically conductive pattern disposed at the first side of the electrically insulating substrate, wherein the third capacitor member and the fourth capacitor member are configured to serve as parts of the radio frequency resonance circuit, wherein the third capacitor member and the fourth capacitor member at least partially overlap in the direction perpendicular to a surface of the electrically insulating substrate;
   a sensing coil comprising at least the second capacitor member, the third capacitor member, and the at least two electrically conductive bridge patterns, the sensing coil having a sensing coil area that, at least partially overlaps a region between the at least two electrically conductive bridge patterns of the galvanic connection between the second capacitor member and the third capacitor member, and wherein the sensing coil is connectable to a radio frequency transmitter;
   wherein the second capacitor member comprises at least two mutually insulated second capacitor member portions, the third capacitor member comprises at least two mutually insulated third capacitor member portions, and each of the at least two electrically conductive bridge patterns galvanically connecting one of the two mutually insulated second capacitor member portions with one of two mutually insulated third capacitor member portions;
   wherein a resonance frequency of the sensing coil is higher than the resonance frequency of the radio frequency resonance circuit.

9. The radio frequency coil unit as set forth in claim 8, wherein the radio frequency coil member, the first capacitor member, the second capacitor member, and the at least one electrically insulating substrate are laminated.

10. The radio frequency coil unit as set forth in claim 8, further comprising a printed circuit board;
wherein the at least one electrically insulating substrate is formed by a non-conducting substrate of the printed circuit board, and the at least one radio frequency coil member is formed as a first conductive pattern and the first capacitor member is formed as a second conductive pattern, the first and second conductive pattern being laminated to the first side of the non-conducting substrate, and
wherein the second capacitor member is formed as a third conductive pattern being laminated to a second side of the non-conducting substrate which is opposite of the first side.

11. The radio frequency coil unit as set forth in claim 8, further comprising at least one short circuit member, wherein the at least two electrically conductive bridge patterns are galvanically connected by the least one short circuit member.

12. The radio frequency coil unit as set forth in claim 8, further comprising:
at least one lumped tuning capacitor that is galvanically connected to two electrically conductive patterns disposed at the first side of the electrically insulating substrate and is configured for tuning a resonance frequency of the radio frequency resonance circuit.

13. The radio frequency coil unit as set forth in claim 9, further comprising a printed circuit board;
wherein the at least one electrically insulating substrate is formed by a non-conducting substrate of the printed circuit board, and wherein the at least one radio frequency coil member is formed as a first conductive pattern and the first capacitor member is formed as a second conductive pattern, the first and second conductive pattern being laminated to the first side of the non-conducting substrate, and
wherein the second capacitor member is formed as a third conductive pattern being laminated to a second side of the non-conducting substrate which is opposite of the first side.

14. The radio frequency coil unit as set forth in claim 9, further comprising:
at least one lumped tuning capacitor that is galvanically connected to two electrically conductive patterns disposed at the first side of the electrically insulating substrate and is configured for tuning a resonance frequency of the radio frequency resonance circuit.

15. A radio frequency coil unit for use in a magnetic resonance imaging system, the radio frequency coil unit comprising:
an electrically insulating substrate;
a radio frequency coil disposed on a first side of the electrically insulating substrate, the radio frequency coil having a first resonance frequency and having first and second ends;
a sensing coil disposed on a second side of the electrically insulating substrate opposite from the first side of the electrically insulating substrate, the sensing coil including at least one electrically conductive bridge pattern disposed on the second side of the electrically insulating substrate, wherein:
each electrically conductive bridge pattern has a first end which is capacitively coupled with the first end of the radio frequency coil and a second end which is capacitively coupled with the second end of the radio frequency coil; and
the sensing coil has a second resonance frequency which is higher than the first resonance frequency.

16. The radio frequency coil unit of claim 15 wherein the at least one electrically conductive bridge pattern includes a first electrically conductive bridge pattern disposed on the second side of the electrically insulating substrate and a second electrically conductive bridge pattern disposed on the second side of the electrically insulating substrate, wherein:
the first electrically conductive bridge pattern and the second electrically conductive bridge pattern are spaced apart from each other and are not galvanically connected to each other;
the first electrically conductive bridge pattern has a first end which is capacitively coupled with the first end of the radio frequency coil and a second end which is capacitively coupled with the second end of the radio frequency coil;
the second electrically conductive bridge pattern has a first end which is capacitively coupled with the first end of the radio frequency coil and a second end which is capacitively coupled with the second end of the radio frequency coil; and
the sensing coil has a sensing area disposed between the first electrically conductive bridge pattern and the second electrically conductive bridge pattern.

17. The radio frequency coil unit of claim 15 wherein:
the first end of the at least one electrically conductive bridge pattern is bifurcated with both bifurcations being capacitively coupled with the first end of the radio frequency coil;
the second end of the at least one electrically conductive bridge pattern is bifurcated with both bifurcations being capacitively coupled with the second end of the radio frequency coil;
the sensing coil has a first sensing area portion disposed between the bifurcations of the first end of the at least one electrically conductive bridge; and
the sensing coil has a second sensing area portion disposed between the bifurcations of the second end of the at least one electrically conductive bridge.

* * * * *